United States Patent
Akutsu et al.

(10) Patent No.: US 8,837,869 B2
(45) Date of Patent: Sep. 16, 2014

(54) SOA-PLC HYBRID INTEGRATED POLARIZATION DIVERSITY CIRCUIT AND METHOD FOR MANUFACTURING THE SAME

(71) Applicant: Furukawa Electric Co., Ltd., Tokyo (JP)

(72) Inventors: Takeshi Akutsu, Tokyo (JP); Kazutaka Nara, Tokyo (JP); Masaki Funabashi, Tokyo (JP); Noriyuki Yokouchi, Tokyo (JP); Hideaki Hasegawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 55 days.

(21) Appl. No.: 13/735,601

(22) Filed: Jan. 7, 2013

(65) Prior Publication Data

US 2013/0121632 A1    May 16, 2013

Related U.S. Application Data

(63) Continuation of application No. PCT/JP2012/000662, filed on Feb. 1, 2012.

(30) Foreign Application Priority Data

Feb. 3, 2011   (JP) ................................ 2011-021814

(51) Int. Cl.
*G02B 6/27* (2006.01)
*G02B 6/125* (2006.01)
*H01S 5/042* (2006.01)
*H04J 14/06* (2006.01)

(52) U.S. Cl.
USPC ............................. 385/11; 385/14; 359/344

(58) Field of Classification Search
USPC .......... 385/10, 11, 12, 13, 14, 15, 16; 398/65; 359/325, 344, 346, 333; 372/92, 94, 372/108
See application file for complete search history.

(56) References Cited

U.S. PATENT DOCUMENTS 5,133,028 A * 7/1992 Okayama et al. ................ 385/11
5,555,326 A * 9/1996 Hwang et al. ..................... 385/2

(Continued)

FOREIGN PATENT DOCUMENTS

JP   2001-272560 A   10/2001
JP   2002-311267 A   10/2002

(Continued)

OTHER PUBLICATIONS

International Preliminary Report on Patentability issued Aug. 15, 2013 in PCT/JP2012/000662.
English language translation of the Written Opinion issued May 22, 2012 in PCT/JP2012/000662.
International Search Report and Written Opinion issued May 22, 2012 in PCT/JP2012/000662 with English translation of categories of cited documents.

(Continued)

*Primary Examiner* — Akm Enayet Ullah
(74) *Attorney, Agent, or Firm* — Oblon, Spivak, McClelland, Maier & Neustadt, L.L.P.

(57) ABSTRACT

The invention of the present application provides an SOA-PLC hybrid integrated polarization diversity circuit including a PLC-PBS chip and an SOA-COS whose respective waveguides are coupled to each other. The PLC-PBS chip includes: first and second optical waveguides; a Mach-Zehnder interferometer circuit; and a half-wave plate placed in the first optical waveguide which TM mode light is split into. The SOA-COS includes: a third optical waveguide connected to the first optical waveguide; a fourth optical waveguide connected to the second optical waveguide; and an SOA formed in at least one of the third and fourth optical waveguides. One end of the third optical waveguide and one end of the fourth optical waveguide are connected to a U-turn optical waveguide, the one ends being not connected to the first optical waveguide and the second optical waveguide, respectively.

7 Claims, 14 Drawing Sheets

(56) References Cited

U.S. PATENT DOCUMENTS

| | | | | |
|---|---|---|---|---|
| 6,033,126 | A * | 3/2000 | Omori et al. | 385/88 |
| 6,104,850 | A * | 8/2000 | Dong | 385/29 |
| 7,738,527 | B2 * | 6/2010 | He | 372/94 |
| 7,916,984 | B2 * | 3/2011 | Kim et al. | 385/14 |
| 8,280,200 | B2 * | 10/2012 | Doi et al. | 385/2 |
| 8,643,943 | B2 * | 2/2014 | Todt | 359/346 |
| 2002/0146217 | A1 * | 10/2002 | Nobuhara et al. | 385/84 |
| 2005/0123234 | A1 | 6/2005 | Kanie et al. | |
| 2008/0031566 | A1 | 2/2008 | Matsubara et al. | |
| 2008/0123701 | A1 * | 5/2008 | He | 372/23 |
| 2011/0038036 | A1 * | 2/2011 | Todt | 359/341.1 |

FOREIGN PATENT DOCUMENTS

| | | |
|---|---|---|
| JP | 2003-207668 A | 7/2003 |
| JP | 2005-157163 A | 6/2005 |
| JP | 2008-275708 A | 11/2008 |
| WO | WO 2006/013928 A1 | 2/2006 |

OTHER PUBLICATIONS

Ken Morito, et al., "Record High Saturation Power (+22 dBm) and Low Noise Figure (5.7 dB) Polarization-Insensitive SOA Module", IEEE Photonics Technology Letters, vol. 17, No. 6, Feb. 2005, pp. 1298-1300.

* cited by examiner

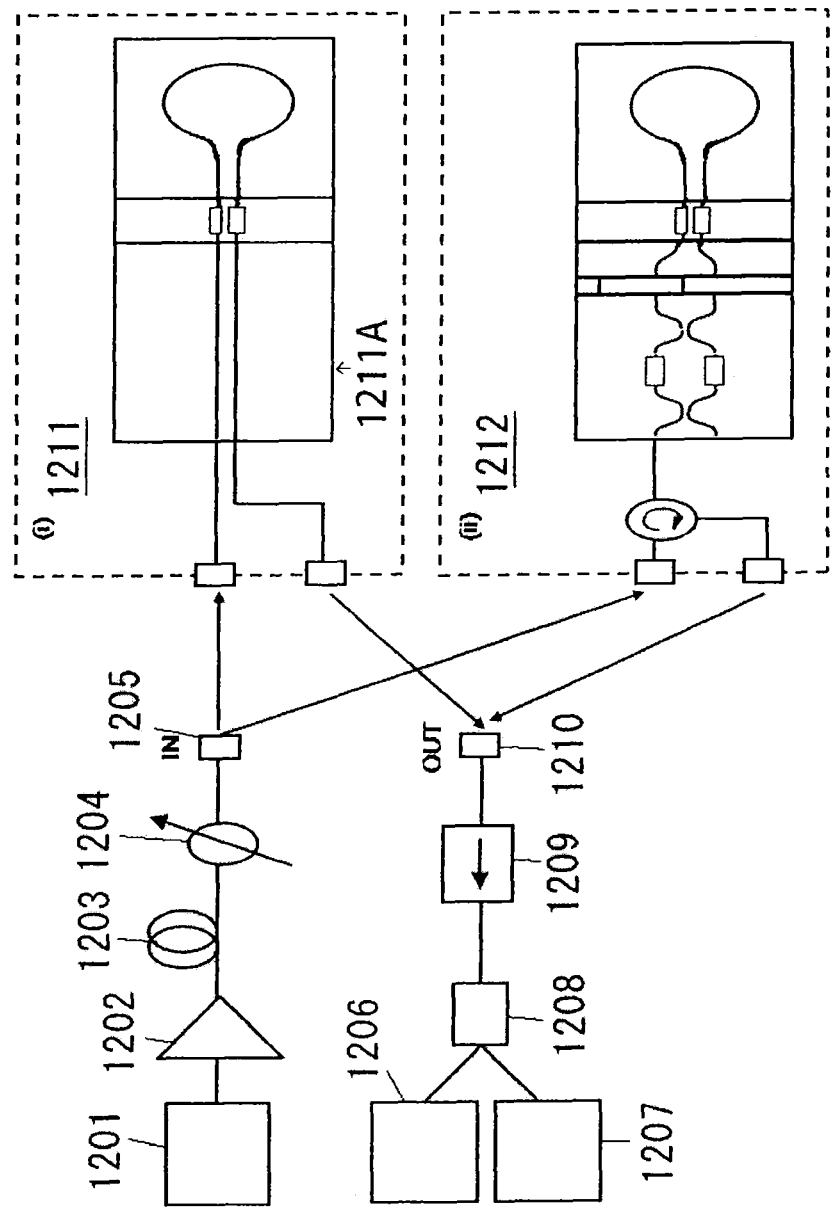

SOA-PLC HYBRID INTEGRATED POLARIZATION DIVERSITY CIRCUIT AND METHOD FOR MANUFACTURING THE SAME

CROSS-REFERENCES TO RELATED APPLICATIONS

This application is a continuation application of International Application No. PCT/JP2012/000662, filed Feb. 1, 2012, which claims the benefit of Japanese Patent Application No. 2011-021814, filed Feb. 3, 2011. The contents of the aforementioned applications are incorporated herein by reference in their entireties.

BACKGROUND OF THE INVENTION

1. Field of the Invention

The present invention relates to an SOA-PLC hybrid integrated polarization diversity circuit and a method for manufacturing the same, the circuit including a semiconductor optical amplifier (SOA) and a polarization beam splitter (PBS) which is a planar lightwave circuit (PLC).

2. Description of the Related Art

In recent years, with the increase of data volume in optical communication networks, compact and low-cost optical devices have been demanded. A trend is currently changing such that an optical waveguide device technique based on a photonic integrated circuit (PIC) technology is dominating a conventional technique of combining individual optical components.

In an optical communication network, it is preferable from a practical viewpoint that an optical waveguide device should have a polarization dependence of 0.1 dB or lower. In order to solve a problem with the polarization dependence in an optical device, a polarization diversity circuit is used.

A polarization independent SOA module for solving the problem with polarization dependent gain (PDG) of an SOA by use of a polarization diversity circuit is disclosed in K. Morito and S. Tanaka, "Record High Saturation Power (+22 dBm) and Low Noise FIG. (5.7 dB) Polarization-Insensitive SOA Module," IEEE PHOTONICS TECHNOLOGY LETTERS, 17, 6, 1298-1300, (2005) (hereinafter Non-patent Literature 1). As shown in FIG. 14, the polarization independent SOA module uses a circulator 1409 having three ports 1401 to 1403, lenses 1404, a semitransparent mirror 1405 serving as a PBS, a half-wave plate 1406, mirrors 1407, and an SOA 1408, which are spatially-separated individual optical components.

However, the polarization independent SOA module disclosed in Non-patent Literature 1 uses the spatially-separated individual optical components, and thus has a large module size as a whole. In addition, since the module disclosed in Non-patent Literature 1 uses the optical components such as the semitransparent mirror 1405 and the mirrors 1407, formation of the module shown in FIG. 14 requires user's optical axis adjustment among the optical components, which is very troublesome. Hence, application such as incorporation of the module into another device is difficult. For this reason, it is believed that commercial use of the module disclosed in Non-patent Literature 1 is difficult.

SUMMARY OF THE INVENTION

An object of the present invention is to provide an SOA-PLC hybrid integrated polarization diversity circuit achieving a smaller module (circuit) size than that of a conventional module and thus allowing the circuit to be easily incorporated into another device.

The present invention provides an SOA-PLC hybrid integrated polarization diversity circuit characterized as follows. Specifically, the SOA-PLC hybrid integrated polarization diversity circuit includes a PLC-PBS chip and an SOA-COS whose respective waveguides are coupled to each other. The PLC-PBS chip includes: a first optical waveguide and a second optical waveguide; a Mach-Zehnder interferometer circuit configured to divide inputted light into TM mode light and TE mode light and to output the divided TM mode light to the first optical waveguide and the divided TE mode light to the second optical waveguide; and a polarization rotation mechanism built in the first optical waveguide by which the TM mode light is converted to the TE mode light and the TE mode light is to the TM mode light vice versa. The SOA-COS includes: a third optical waveguide connected to the first optical waveguide; a fourth optical waveguide connected to the second optical waveguide; and an SOA formed in at least one of the third and fourth optical waveguides. One end of the third optical waveguide and one end of the fourth optical waveguide are connected to a U-turn optical waveguide, the one ends being not connected to the first optical waveguide and the second optical waveguide, respectively.

The SOA-PLC hybrid integrated polarization diversity circuit according to the present invention achieves a smaller module (circuit) size than that of a conventional module and thus allowing the circuit to be easily incorporated into another device.

BRIEF DESCRIPTION OF THE DRAWINGS

FIG. 12 is a schematic view showing two types of structures 1211 and 1212 for measuring polarization dependent gain of SOAs in Example of the present invention.

DESCRIPTION OF THE PREFERRED EMBODIMENTS (First Embodiment)
(Structure)

Figure 1:
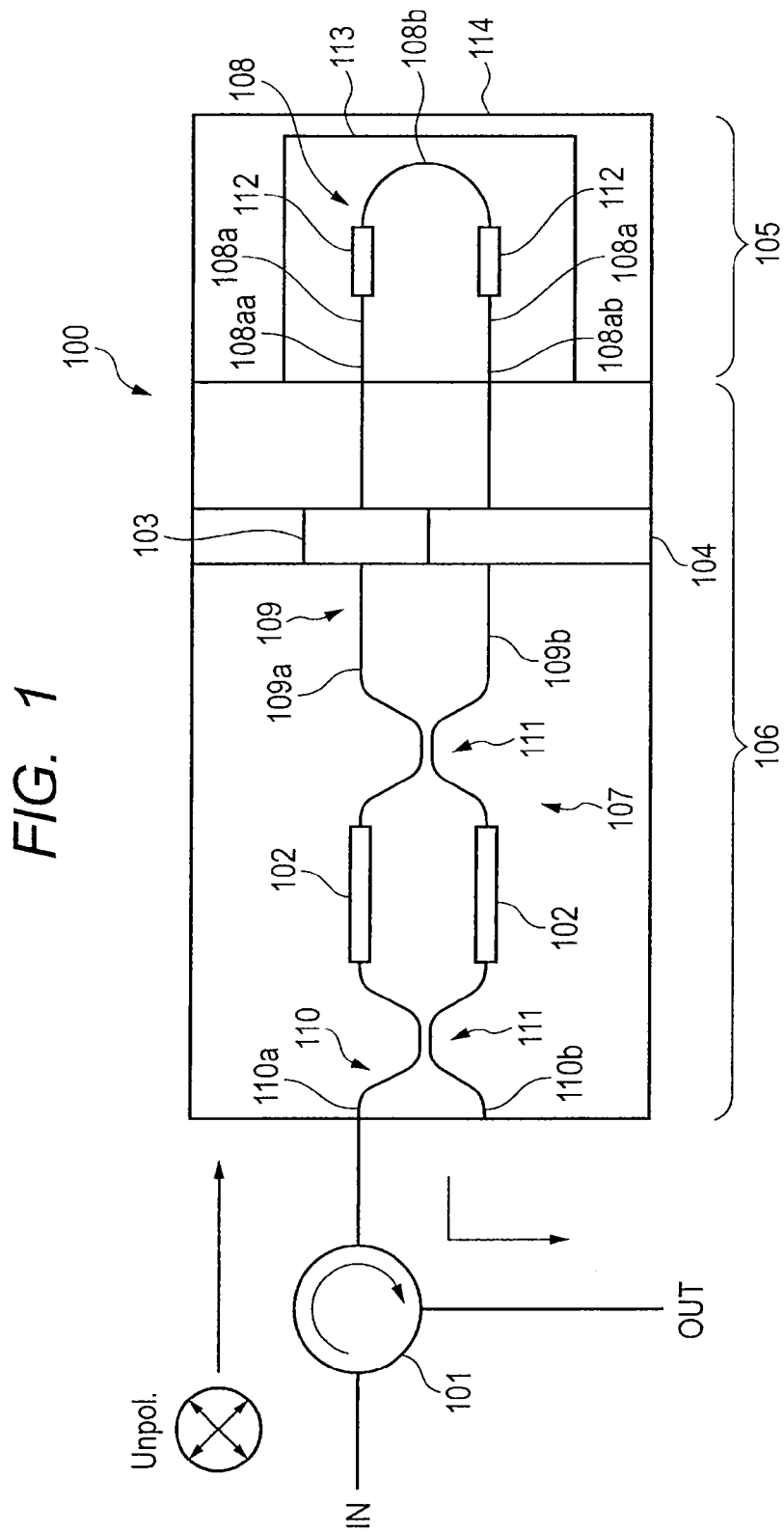
FIG. 1 is a schematic view showing an SOA-PLC hybrid integrated polarization diversity circuit according to a first embodiment of the present invention.

FIG. 1 is a schematic view showing a basic structure of an SOA-PLC hybrid integrated polarization diversity circuit 100 according to a first embodiment of the present invention. The SOA-PLC hybrid integrated polarization diversity circuit 100 has a structure in which waveguides of a silica-based planar lightwave circuit-polarization beam splitter (PLC-PBS) chip 106 and a semiconductor optical amplifier-chip on submount (SOA-COS) 105 are coupled to each other.

The PLC-PBS chip 106 includes: silica-based optical waveguides 109, 110; a slit 104 which is a region formed by partially cutting the silica-based optical waveguide 109; a Mach-Zehnder interferometer circuit (MZI) 107 which serves as a PBS; and a half-wave plate 103. The MZI 107 includes an input port 110a and an output port 110b serving as the silica-based optical waveguides, two directional couplers 111, two output ports 109a, 109b serving as the silica-based optical waveguides, and two interferometer arms (heaters) 102. Note that TM mode light is outputted from the output port 109a of the MZI 107, while TE mode light is outputted from the output port 109b. The half-wave plate 103 is placed in the slit 104 in a portion near the output port 109a from which the TM mode light is outputted.

The SOA-COS 105 includes: a semiconductor optical waveguide 108 having linear portions 108a and a U-turn portion 108b; and an SOA chip 113 on which SOAs 112 are formed in the linear portions 108a, respectively. The SOA chip 113 is mounted on a silicon bench 114 by soldering.

Each linear portion 108a of the semiconductor optical waveguide 108 is formed in a buried mesa structure to be described later, while the U-turn portion 108b of the semiconductor optical waveguide 108 is formed in a high-mesa structure to be described later. Such a configuration makes it possible to confine light to more extent in the U-turn portion 108b and to reduce light loss due to bending even when the U-turn portion 108b has a small radius of curvature (for example, 125 μm). Thus, both an optical amplification characteristic and a noise characteristic can be made favorable. Nevertheless, both of the linear portion 108a and the U-turn portion 108b of the semiconductor optical waveguide may have the high-mesa structure or the mesa structure.

Since the SOA-COS 105 has the U-turn portion 108b in the semiconductor optical waveguide 108, an output-input portion 108aa and an output-input portion 108ab of the SOAs 112 are formed on the PLC-PBS chip 106 side of the SOA-COS 105. In this respect, forming the U-turn portion 108b makes it possible to input and output light on the same end face of the SOA-COS 105 and thus to make the circuit size smaller as a whole.

In this embodiment, the SOAs 112 are formed at two positions in the respective linear portions 108a of the semiconductor optical waveguide 108. However, the SOA 112 may be formed at one position, as long as the SOA 112 is so long that a sufficient optical amplification effect is obtained.

Figure 2:
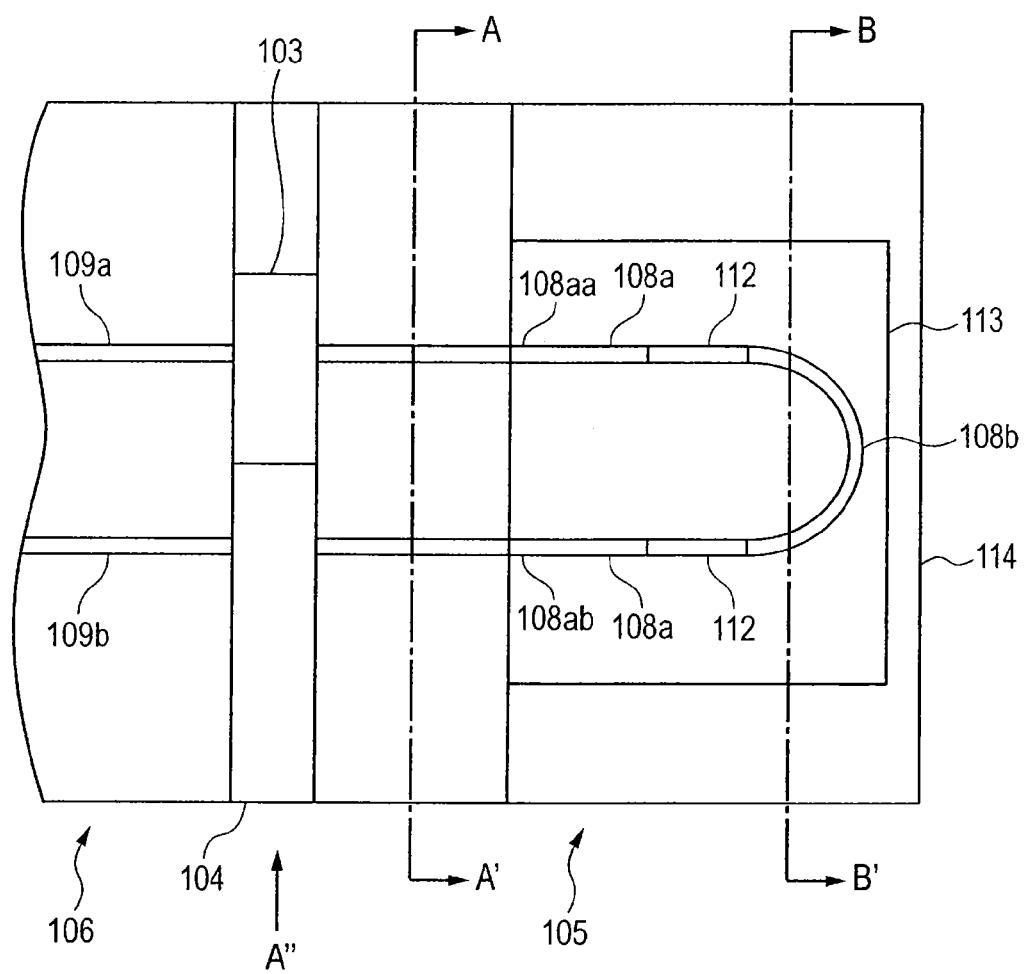
FIG. 2 is a plan view showing in detail a vicinity of a bonding portion where a PLC-PBS chip and an SOA-COS are bonded together in the SOA-PLC hybrid integrated polarization diversity circuit according to the first embodiment of the present invention.

FIG. 2 is a plan view showing in detail a vicinity of a bonding portion where the PLC-PBS chip 106 and the SOA-COS 105 are bonded together. Specifically, FIG. 2 shows the output port 109a and the output port 109b of the MZI 107, the slit 104, and the half-wave plate 103 placed in the slit 104, all of which are included in the PLC-PBS chip 106. FIG. 2 also shows the SOAs 112, the output-input port 108aa and the output-input port 108ab of the respective SOAs 112, the silicon bench 114, the SOA chip 113, and the linear portions 108a and the U-turn portion 108b of the semiconductor optical waveguide 108, all of which are included in the SOA-COS 105.

Figure 3A:
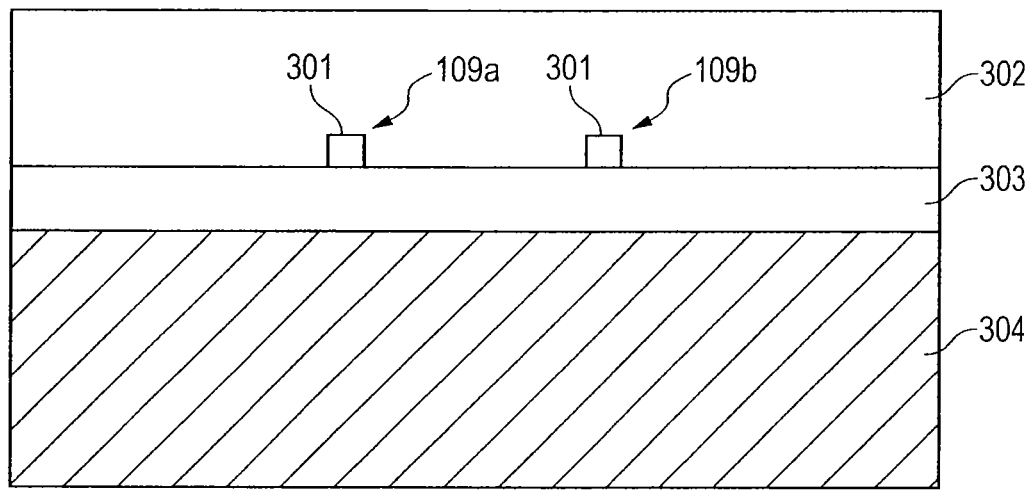
FIG. 3A is a cross-sectional view of the PLC-PBS chip, taken along the A-A' line shown in FIG. 2.

FIG. 3A shows a cross-sectional view of the PLC-PBS chip 106, taken along the A-A' line shown in FIG. 2. A silica-based lower clad layer 303, a core layer 301 forming the silica-based optical waveguides 109a, 109b, and an upper clad layer 302 are formed on a PLC platform 304.

Figure 3B:
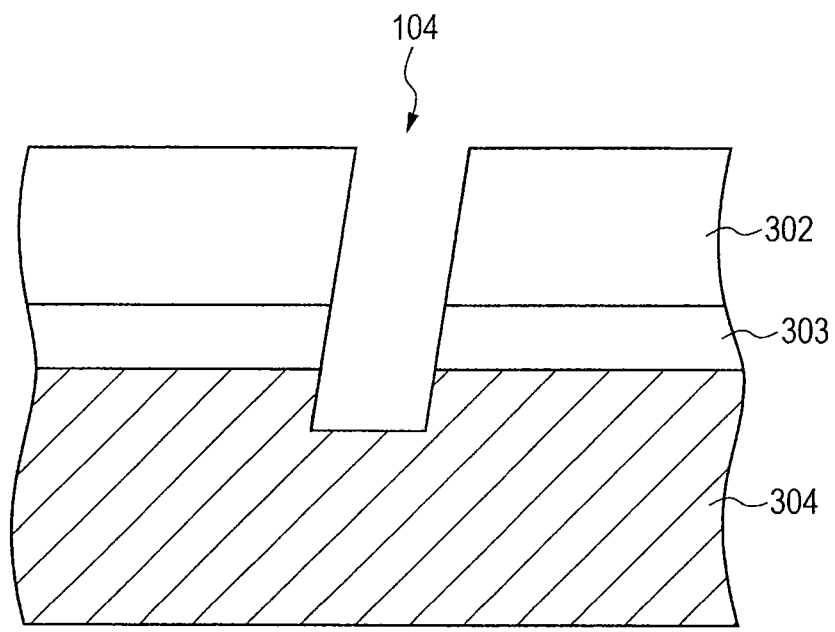
FIG. 3B is a side view of a vicinity of a recessed portion for forming a half-wave plate of the PLC-PBS chip, seen in a direction A" shown in FIG. 2.

FIG. 3B is a cross-sectional view of a vicinity of the slit 104 of the PLC-PBS chip 106, seen in a direction A" shown in FIG. 2. In order to reduce propagation loss and reflected return light caused by reflection, by the slit 104, of light propagated in the core layers 301, the slit 104 is formed at a certain angle, not perpendicularly, with an upper surface of the PLC-PBS chip 106, as shown in FIG. 3B. For example, the slit 104 has a width of about 20 μm to 80 μm and an inclination of about 5° to 12° with respect to a perpendicular to the upper surface of the PLC-PBS chip 106.

Figure 4:
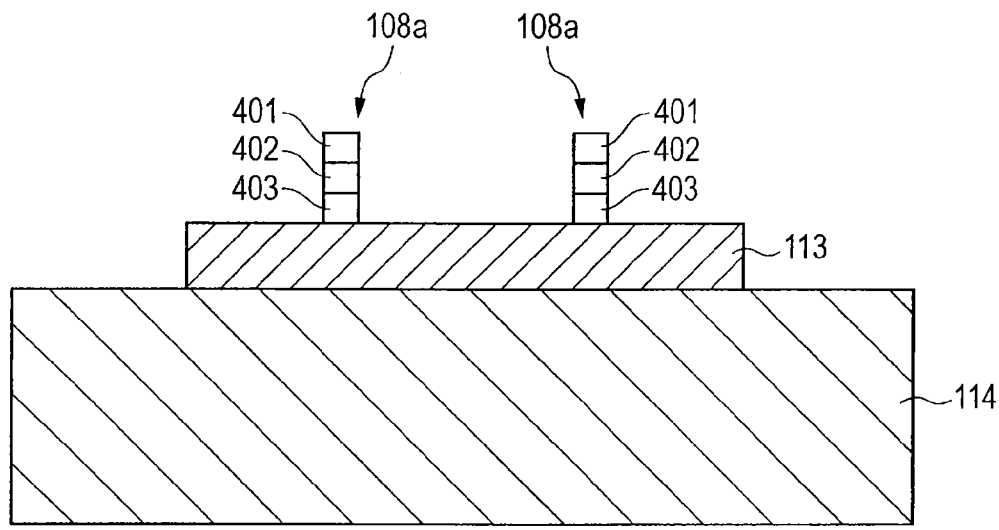
FIG. 4 is a cross-sectional view of a U-turn portion of a semiconductor optical waveguide of the SOA-COS, taken along the B-B' line shown in FIG. 2.

FIG. 4 shows a cross-sectional view of the U-turn portion 108b of the semiconductor optical waveguide 108 of the SOA-COS 105, taken along the B-B' line shown in FIG. 2. The SOA-COS 105 has a structure in which the SOA chip 113 is mounted on the silicon bench 114. The SOA chip 113 uses the high-mesa structure in which a lower clad layer 403, a core layer 402 forming the U-turn portion 108b of the semiconductor optical waveguide 108, and an upper clad layer 401 are formed.

The SOA-COS 105 is formed on a compound semiconductor InP substrate by using microprocessing techniques. The lower clad layer 403 is made of InP. The core layer 402 is made of a compound semiconductor InGaAsP. The upper clad layer 401 is made of InP. Here, the SOA-COS 105 according to this embodiment and other embodiments to be described below may be made of a semiconductor material other than InP. In addition, the waveguide chip according to this embodiment is not limited to one including a semiconductor optical waveguide having an SOA or the like, and is applicable to any polarization dependent waveguide such as a LiNbO$_3$ optical waveguide or a silicon-based optical waveguide.

Here, in an optical waveguide of a silica-based PLC, a relative refractive index difference between a core and a clad forming the optical waveguide is generally about 2.5% at maximum. However, in a semiconductor optical waveguide made of the compound semiconductor InP or the like, a relative refractive index difference between a core and a clad is more than a range from 4% to 5%. In this embodiment, the U-turn semiconductor optical waveguide (U-turn portion 108b) is formed in the high-mesa structure as shown in FIG. 4, and thereby the relative refractive index difference between the core layer 402 and air or dielectrics on both sides thereof is very large, 30% to 40% or higher, for example. In addition, the larger the relative refractive index difference between the core and the clad is, the smaller the radius of curvature in a turning portion of the optical waveguide can be made. For example, in this embodiment, the radius of curvature is about 125 μm. For this reason, the chip size can be made smaller in a case where the high-mesa structure is formed as a turning structure of a U-turn optical waveguide on the SOA-COS 105 than in a case where a turning structure of a U-turn optical waveguide is formed on a silica-based PLC chip. In this embodiment, the U-turn portion 108b is formed as the semiconductor optical waveguide and further in a high-mesa structure, and thereby the size of the U-turn portion 108b and consequently the circuit size as a whole can be made smaller.

Each SOA 112 is formed in the buried mesa structure in the corresponding linear portion 108a of the semiconductor optical waveguide 108. The core layer 402 of the SOA 112 includes an active layer (not shown) made of a light amplifying medium. The SOA 112 can also be used as a semiconductor gate configured to switch on/off incident light by switching on/off an injected current. Here, generally, when the SOA 112 is too short, a desired gain cannot be obtained; meanwhile, when the SOA 112 is too long, propagated light is likely to have noise, so that the noise characteristic is deteriorated. Hence, the SOA 112 preferably has a length of about 0.5 mm to 2 mm, for example.

As shown in FIG. 1, in the SOA-PLC hybrid integrated polarization diversity circuit 100 according to this embodiment, each silica-based optical waveguide 109 of the PLC-PBS chip 106 and the corresponding linear portion 108a of the semiconductor optical waveguide 108 of the SOA-COS 105 are aligned and bonded to each other.

Since the SOA chip 113 of the SOA-COS 105 is thinner than the PLC-PBS chip 106, the SOA chip 113 is mounted on the silicon bench 114. This makes it possible to secure a larger area of the bonding portion where the PLC-PBS chip 106 and the SOA-COS 105 are bonded together, and thus to obtain sufficient strength for the bonding.

Figure 5A:
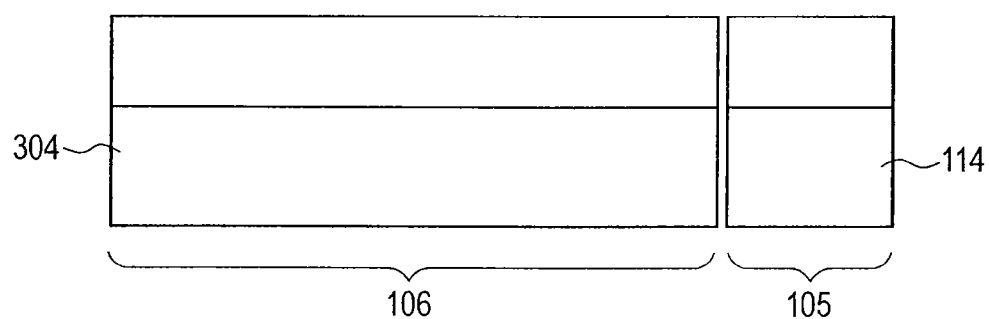
FIG. 5A is a schematic view showing an arrangement example of the PLC-PBS chip and the SOA-COS which are seen from side surfaces thereof in the SOA-PLC hybrid integrated polarization diversity circuit according to one embodiment of the present invention.
Figure 5B:
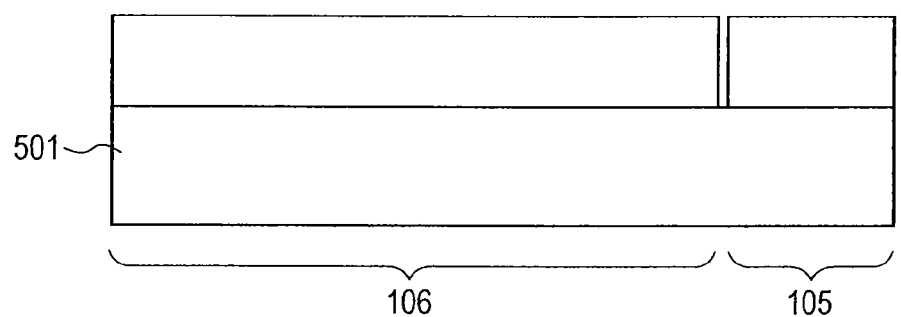
FIG. 5B is a schematic view showing another arrangement example of the PLC-PBS chip and the SOA-COS which are seen from side surfaces thereof in the SOA-PLC hybrid integrated polarization diversity circuit according to one embodiment of the present invention.

In this embodiment, the optical waveguides of the PLC-PBS chip 106 and the SOA-COS 105 are coupled together on the basis of chips, as shown in FIG. 5A. Further in this embodiment, a silicon substrate-terrace structure may also be used in which the PLC-PBS chip 106 and the SOA-COS 105 share a silicon substrate 501 serving as a base, as shown in FIG. 5B. In this structure also, the waveguides of the PLC-PBS chip 106 and the SOA-COS 105 are coupled together, while the base silicon substrate 501 is shared. The structure of this waveguide coupling is also applicable to all the embodiments to be described later.

(Operations)

In the SOA-PLC hybrid integrated polarization diversity circuit 100 according to this embodiment, unpolarized light entering from an input IN is propagated to the SOA-PLC hybrid integrated polarization diversity circuit 100 by a circulator 101. Light exiting from the SOA-PLC hybrid integrated polarization diversity circuit 100 is propagated to an output OUT by the circulator 101.

A MZI generally has a phase difference $\Delta\phi$ between two arms. When birefringence occurs in the MZI arms, phase differences in the respective TE and TM modes change independently from each other. A difference between the phase difference $\Delta\phi_{TE}$ in the TE mode and the phase difference $\Delta\phi_{TM}$ in the TM mode is expressed by $|\Delta\phi_{TE}-\Delta\phi_{TM}|=(2\pi/\lambda)$ B·L where $\lambda$ is a wavelength, B is a birefringence index in the MZI, and L is an arm length of the MZI. When $|\Delta\phi_{TE}-\Delta\phi_{TM}|$ is $(2n+1)\pi$ (n is an integer), the MZI divides the incident unpolarized light into two mutually orthogonal modes (that is, the TE mode and the TM mode) of light. The TE mode light is outputted to one output port, while the TM mode light is outputted to the other output port.

The unpolarized light propagated from the circulator 101 is divided into two mutually orthogonal modes (that is, the TE mode and the TM mode) of light. In the structure according to this embodiment, the TE mode light emitted from the MZI 107 is propagated to the output port 109b, while the TM mode light is propagated to the output port 109a. The TM mode light outputted from the output port 109a is turned into the TE mode light by the half-wave plate 103. As a result, only the TE mode light is propagated to the SOA-COS 105.

A typical SOA has, for example, a five-quantum well structure, a saturation power of 12 dB, and a low noise figure of approximately 4 dB or lower. Polarization dependent gain of the SOA itself is approximately 10 dB to 20 dB. Of the light made incident on the SOA, the TE mode light has a small signal gain of approximately 19 dB, while the TM mode light is absorbed and has a gain of about −10 dB to 0 dB.

For this reason, propagating only the TE mode light to the SOA-COS 105 as in this embodiment makes it possible to not only obtain a large gain but also reduce the PDG of the SOA 112.

As described above, in the conventional polarization independent SOA module, use of spatially-separated individual optical components leads to a relatively large size of the module as a whole. In addition, use of optical components such as a semitransparent mirror causes the user to have troublesome optical axis adjustment among the optical components. For the reasons above and the like, the conventional polarization independent SOA module has a problem that application such as mass production of the module and incorporation thereof into another device is difficult.

However, in the first embodiment, the SOA-PLC hybrid integrated polarization diversity circuit 100 is configured such that the U-turn portion 108b is provided in the SOA-COS 105 to enable light to be inputted to and outputted from the one end face of the SOA-COS 105, and that both input light and output light to and from the SOA-COS 105 are guided to the PLC-PBS chip 106 configured to separate the polarized waves and to unite the separated polarized waves. Thus, unlike the conventional technique, there is no need to separately provide an input path and an output path to the SOA, and the size of the polarization independent SOA module (circuit) can be made smaller than that of the conventional module.

Also, in this embodiment, the MZI 107 serving as the PBS and the PLC-PBS chip 106 serving as the PLC having the half-wave plate 103 placed in the waveguide, on the TM mode output side, of the MZI 107 are used instead of the optical components such as the semitransparent mirror and the lens. Thus, the troublesomeness of the user's optical axis adjustment is eliminated.

Further, in this embodiment, once a design mask for the PLC-PBS chip 106 which is a component of the polarization diversity circuit is manufactured, mass production is possible using existing techniques for a semiconductor integrated circuit and a PLC.

Besides, in this embodiment, a single waveguide device is formed by coupling the waveguides of the SOA-COS 105 and the PLC-PBS chip 106 which are waveguide chips. This leads to easy application such as incorporation into another device. Thus, the SOA-PLC hybrid integrated polarization diversity circuit 100 is very effective in commercial use.

Moreover, in this embodiment, only the TE mode light is propagated to the SOA-COS 105. Thus, it is possible to reduce the PDG of the SOA 112.

(Manufacturing Method)

In the PLC-PBS chip 106, the optical waveguides made of a silica-based material are formed on the silicon or quartz substrate by combining microprocessing techniques.

Generally, a PLC is formed by a flame hydrolysis deposition (FHD) method which is an application of an optical fiber manufacturing technique. Specifically, glass particles to form a lower clad layer and a core layer are deposited on a PLC substrate (for example, a silicon substrate) and heated to fuse and make the glass film transparent. Thereafter, a desired optical waveguide pattern is formed by the photolithography and reactive-ion etching which are typical manufacturing techniques of semiconductor integrated circuit. Then, an upper clad layer is formed by the FHD method again.

Birefringence can be trimmed on the silica glass waveguide by locally heating or UV irradiation. By appropriately trimming the birefringence, a PBS can be formed in the silica-based PLC chip.

The heaters 102 are formed on the two arms of the MZI 107 to trim the birefringence in the MZI 107. While the birefringence is being trimmed by the heaters 102, measurements are performed to obtain an appropriate phase difference between the two arms of the MZI 107. The PLC-PBS chip 106 is set so as to have a polarization extinction ratio of a predetermined value (15 dB, for example) at a predetermined light wavelength (1530 nm, for example).

In order to place the half-wave plate 103 in the PLC-PBS 106, the slit 104 is formed over the two output port waveguides 109a, 109b of the MZI 107. And the half-wave plate is placed in one of the output ports, either 109a or 109b in such a manner as to orthogonally cross the silica-based optical waveguides 109, as shown in FIG. 1. Here, the slit 104 is formed by using a dicer or the like. In order to prevent light reflection, the slit 104 is formed at a predetermined inclination angle with the upper surface of the PLC-PBS chip 106, as shown in FIG. 3B.

In the SOA-PLC hybrid integrated polarization diversity circuit 100 according to this embodiment, each silica-based optical waveguide 109 of the PLC-PBS chip 106 and the corresponding linear portion 108a of the semiconductor optical waveguide 108 of the SOA-COS 105 are in contact with each other on a single contact surface, and aligned and bonded.

Specifically, with reference to FIG. 6, the SOA-PLC hybrid integrated polarization diversity circuit 100 according to this embodiment is manufactured by a manufacturing method as follows.

(Step 1)

Figure 6:
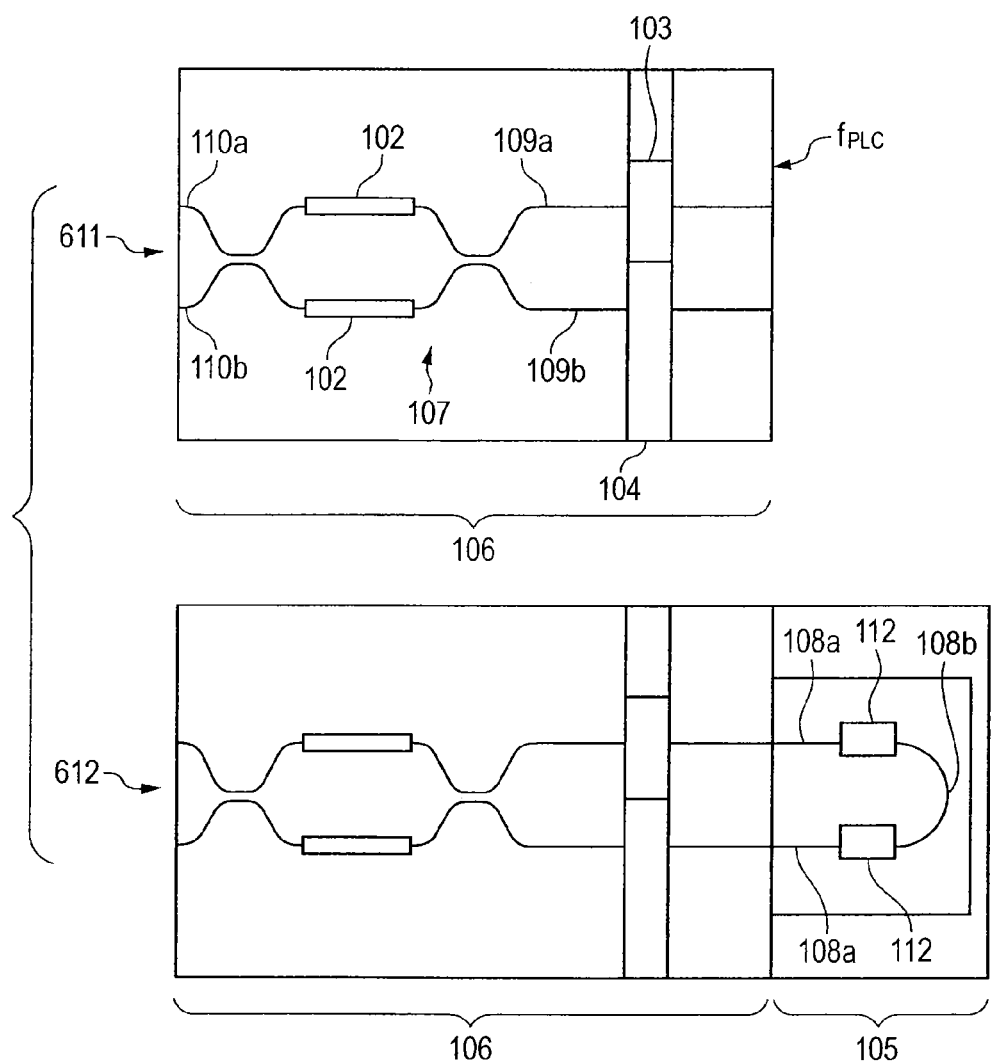
FIG. 6 is a schematic view for explaining a method for manufacturing an SOA-PLC hybrid integrated polarization diversity circuit according to the first embodiment of the present invention.

As indicated by reference numeral 611 in FIG. 6, the PLC-PBS chip 106 is prepared in which the silica-based optical waveguides 110a, 110b, 109a, 109b and the heaters 102 are formed. Test light is propagated from the side of the silica-based optical waveguides 110a, 110b, the heaters 102 are heated for appropriate trimming, and adjustment is made to obtain an appropriate phase difference between the two arms of the MZI 107.

(Step 2)

A facet $f_{PLC}$ of the PLC-PBS chip 106 to which the SOA-COS 105 is bonded is modified by optical polishing to have a sufficiently fine surface roughness. By this processing, a cross-section of the PLC-PBS chip 106 is formed on which the PLC-PBS chip 106 is coupled to the linear portions 108a and the U-turn portion 108b of the semiconductor optical waveguide 108. The slit 104 is formed by using the dicer or the like in such a manner as to be inclined at a predetermined angle, not perpendicularly, with the upper surface of the PLC-PBS chip 106. The half-wave plate 103 is placed in the slit 104. The half-wave plate 103 is placed on the silica-based optical waveguide 109a side which TM mode light is split into from the MZI 107.

(Step 3)

As indicated by reference numeral 612 in FIG. 6, the SOA-COS 105 is prepared in which the linear portions 108a and the U-turn portion 108b of the semiconductor optical waveguide 108 and the SOAs 112 are formed. By cleaving the SOA-COS 105 to form the linear portions 108a in the semiconductor optical waveguide 108, a bonding surface is formed where the SOA-COS 105 is coupled to the PLC-PBS chip 106. Then, the silica-based optical waveguides 109a, 109b and the semiconductor optical waveguide 108 to be brought in contact with each other are aligned, and the PLC-PBS chip 106 and the SOA-COS 105 are fixed to each other by using an adhesive or the like.

Note that the details, the order, and the like of the processing included in Steps 1 to 3 above may be appropriately adjusted.

The kinds of the materials used for the aforementioned SOA-PLC hybrid integrated polarization diversity circuit 100, parameters, and the like are merely provided for an illustrative purpose, and are not limited thereto in this embodiment and the following embodiments.

(Second Embodiment)
(Structure)

Figure 7:
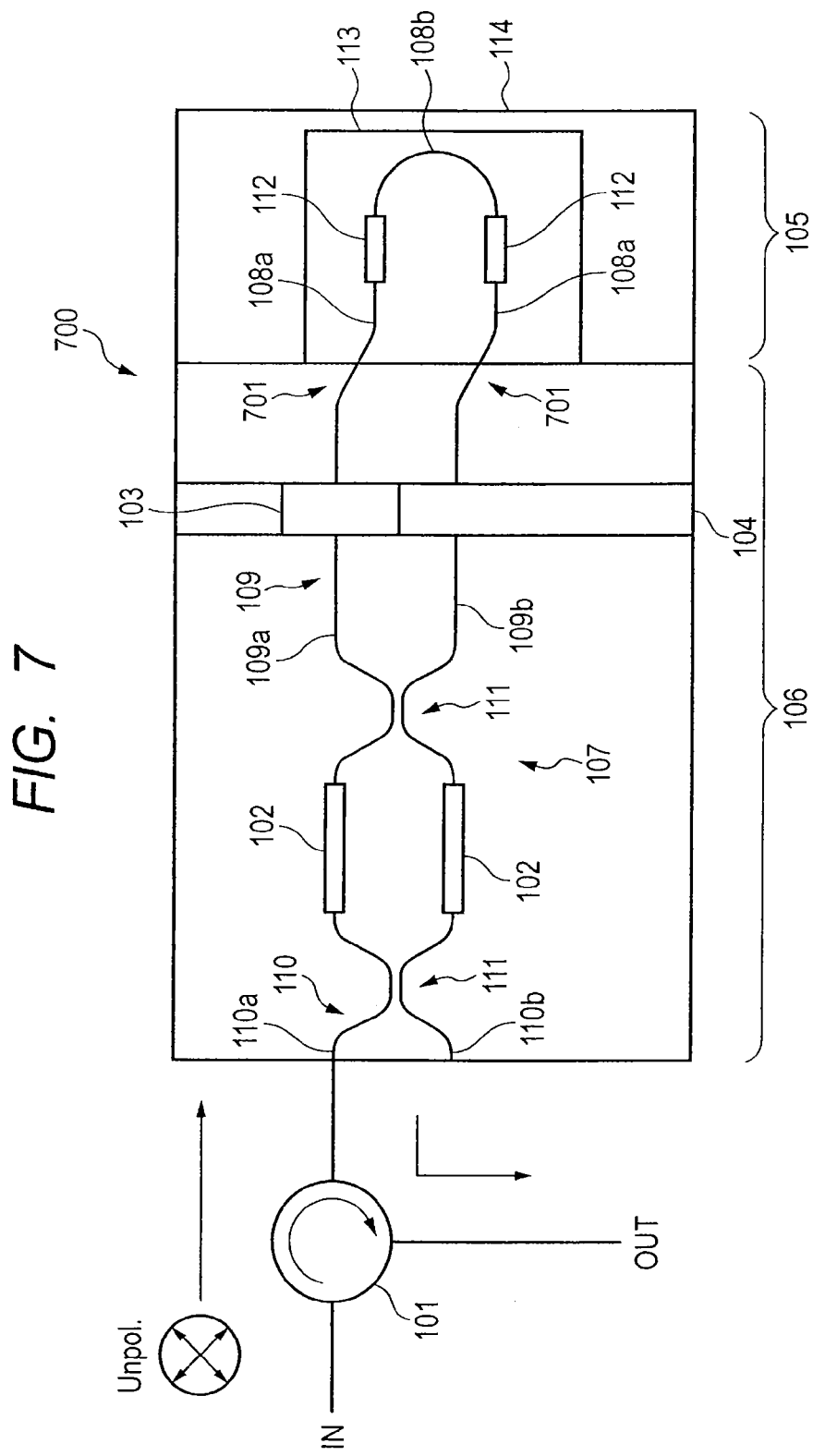
FIG. 7 is a schematic view showing an SOA-PLC hybrid integrated polarization diversity circuit according to a second embodiment of the present invention.

FIG. 7 is a schematic view showing a structure of an SOA-PLC hybrid integrated polarization diversity circuit 700 according to a second embodiment of the present invention. The SOA-PLC hybrid integrated polarization diversity circuit 700 according to the second embodiment has approximately the same structure as the structure of the SOA-PLC hybrid integrated polarization diversity circuit 100 according to the first embodiment. Hence, this embodiment includes operations and advantageous effects of the SOA-PLC hybrid integrated polarization diversity circuit 100 according to the first embodiment. However, this embodiment uses structures 701 provided on a coupling surface on which waveguides of the PLC-PBS chip 106 and the SOA-COS 105 are coupled together, the structures 701 configured to reduce light propagation loss due to a difference in mode field diameter and reflection on the coupling surface.

Figure 8A:
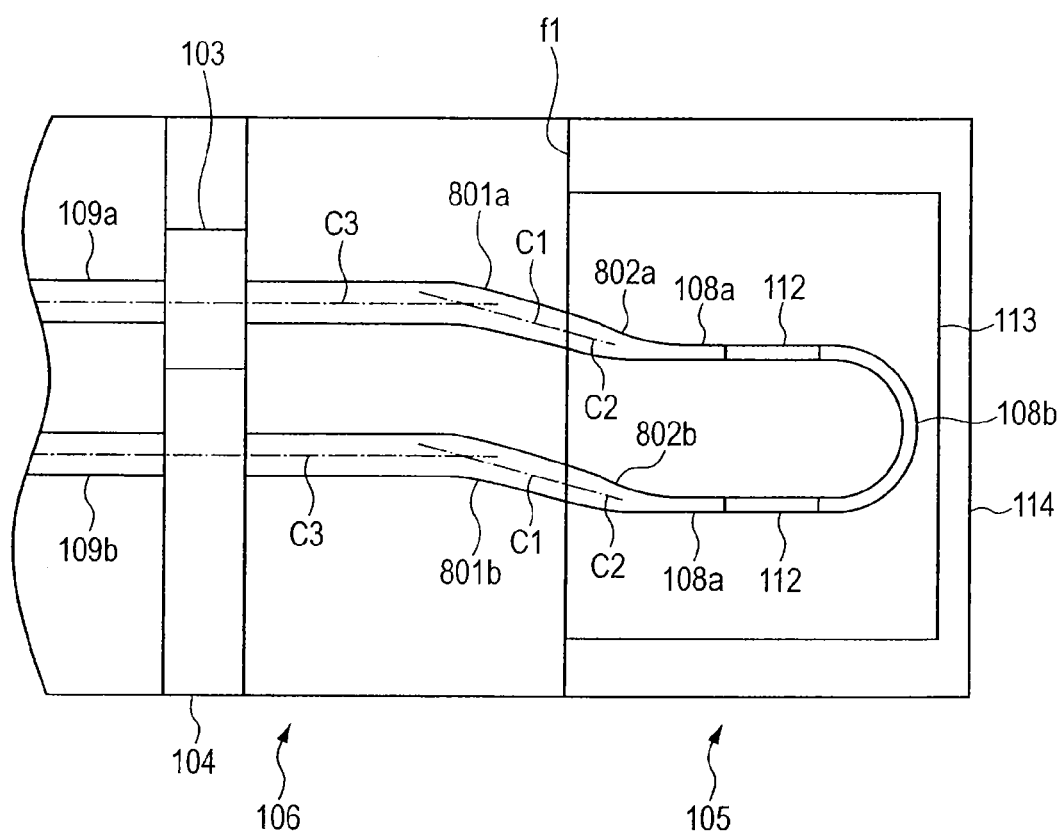
FIG. 8A is a plan view showing in detail a vicinity of a bonding portion where a PLC-PBS chip and an SOA-COS are bonded together in the SOA-PLC hybrid integrated polarization diversity circuit according to the second embodiment of the present invention.

FIG. 8A shows the details of each of the structures 701. As shown in FIG. 8A, the structure 701 includes spot size converters (SSCs) 802a, 802b. In addition, the optical waveguides of the PLC-PBS chip 106 and the SOA-COS 105 are bonded together on a bonding surface f1. The optical waveguides are bonded at a predetermined angle, not perpendicularly, with the bonding surface f1.

Figure 8B:
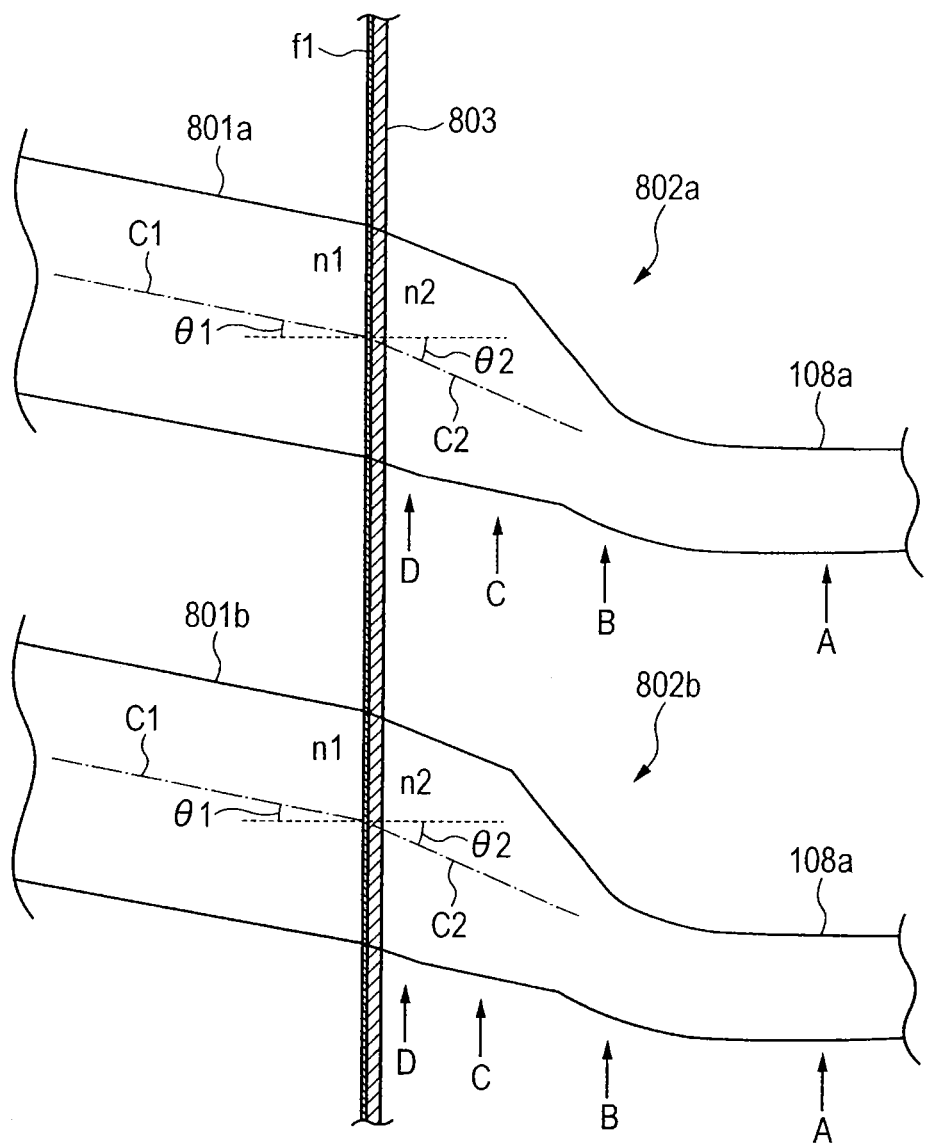
FIG. 8B is a partially enlarged view of the bonding portion on a facet of the SOA-PLC hybrid integrated polarization diversity circuit according to the second embodiment of the present invention.

More specifically, in the structure 701, the linear silica-based optical waveguide 109a (109b) having an axis C3 of the core is smoothly connected to an inclined silica-based optical waveguide 801a (801b) having an axis C1 of the core. FIG. 8B is a partially enlarged view of a bonding portion on the bonding surface f1. As shown in FIG. 8B, the axis C1 is inclined at a predetermined angle $\theta_1$ with the bonding surface f1 so that propagated light can be made incident obliquely on the bonding surface f1. Likewise, each of the inclined semiconductor optical waveguides (that is, the SSCs 802a, 802b) having an axis C2 of the core is smoothly connected to the corresponding linear portion 108a of a semiconductor optical waveguide. The SSCs 802a, 802b which are the inclined semiconductor optical waveguides are inclined at a predetermined angle $\theta_2$ with the bonding surface f1.

A refraction index $n_1$ of the inclined silica-based optical waveguides 801a, 801b, the angle $\theta_1$ between the axis C1 and the perpendicular of the bonding surface f1, a refraction index $n_2$ of the inclined SSCs 802a, 802b, and the angle $\theta_2$ between the axis C2 and the perpendicular of the bonding surface f1 have a relation of $n_1 \sin \theta_1 = n_2 \sin \theta_2$ according to Snell's law. The angles $\theta_1$ and $\theta_2$ are determined so that the relation can be satisfied. In addition, the bonding surface f1 on the SOA-COS 105 side is coated with an anti-reflection (AR) coating 803. Here, it is preferable that the inclination angle $\theta_1$ on the PLC side be 5° to 9° and the inclination angle $\theta_2$ on the semiconductor optical waveguide side be 12° to 17°.

The SSCs 802a, 802b are optical waveguides (wide flared SSCs) which are tapered so that the mode fields of the silica-based optical waveguides 801a, 801b near the bonding surface of the PLC-PBS chip 106 between the PLC-PBS chip 106 and the SOA-COS 105 can match the mode fields of the linear portions 108a of the semiconductor optical waveguide. As shown in FIG. 8B, the SSCs 802a, 802b are formed in parallel to each other. Each of the SSCs 802a, 802b is bent at a portion B having the same width as a portion A, and is tapered to have a larger width at a portion C and a far larger width at a portion D. The SSCs 802a, 802b are formed on the SOA-COS 105 side in this embodiment, but may be formed on the PLC-PBS chip 106 side. Providing the SSCs 802a, 802b makes it possible to reduce coupling loss at the coupling portions of the respective waveguides and thus to obtain a high coupling efficiency.

(Operations)

Since the refraction index $n_1$ of the silica-based optical waveguides such as silica glass in the PLC-PBS chip 106 is different from the refraction index $n_2$ of the semiconductor optical waveguides such as InP in the SOA-COS 105, the mode fields (electric field distributions) of the waveguides are different from each other. For example, the mode field diameter of a silica-based optical waveguide is approximately 3 µm to 8 µm, while the mode field diameter of an InP semiconductor optical waveguide is approximately 1 µm to 2 µm. For this reason, this embodiment uses the structures 701 each for reducing light propagation loss due to the difference in mode field diameter and reflection on the bonding surface on which the silica-based optical waveguides 801a, 801b of the PLC-PBS chip 106 and the semiconductor optical waveguides 802a, B02b of the SOA-COS 105 are coupled.

In each structure 701 according to this embodiment, the difference in mode field diameter can be modified by using a corresponding one of the SSCs 802a, 802b. In addition, the optical waveguides of the chips are coupled together at a predetermined angle, and thereby the reflection can be reduced. Further, the bonding surface f1 (between the PLC-PBS chip 106 and the SOA-COS 105) on the SOA-COS 105 side is coated with the AR coating 803, and thereby the light propagation loss due to the reflection can be reduced.

In this embodiment, the configuration as described above makes it possible to reduce the light propagation loss due to the difference in mode field diameter and the reflection on the bonding surface on which the silica-based optical waveguides 801a, 801b of the PLC-PBS chip 106 and the semiconductor optical waveguides 802a, 802b of the SOA-COS 105 are coupled.

In FIG. 8A, the light is made incident from the linear portions 109a, 109b of the silica-based optical waveguide 109 to the inclined optical waveguides 801a, 801b. Unlike the first embodiment, the light is made incident on the bonding surface f1 at the predetermined angle, not perpendicularly. Since the light is made incident on the bonding surface f1 at the predetermined angle, light reflected on the bonding surface f1 is difficult to return to the inclined optical waveguides 801a, 801b again. Thus, the light reflected on the bonding surface f1 to return to the silica-based optical waveguide 109 is reduced.

Likewise, when returning to the PLC-PBS chip 106 after propagation in the SOA-COS 105, the light is made incident into the inclined semiconductor optical waveguides (that is, the SSCs 802a, 802b). The light is made incident on the bonding surface f1 not perpendicularly but at the predetermined angle as in the first embodiment. Since the light is made incident on the bonding surface f1 at the predetermined angle, the light reflected on the bonding surface f1 is difficult to return to the SSCs 802a, 802b again. Thus, the light reflected on the bonding surface f1 to return to the SSCs 802a, 802b is reduced.

(Manufacturing Method)

Figure 9:
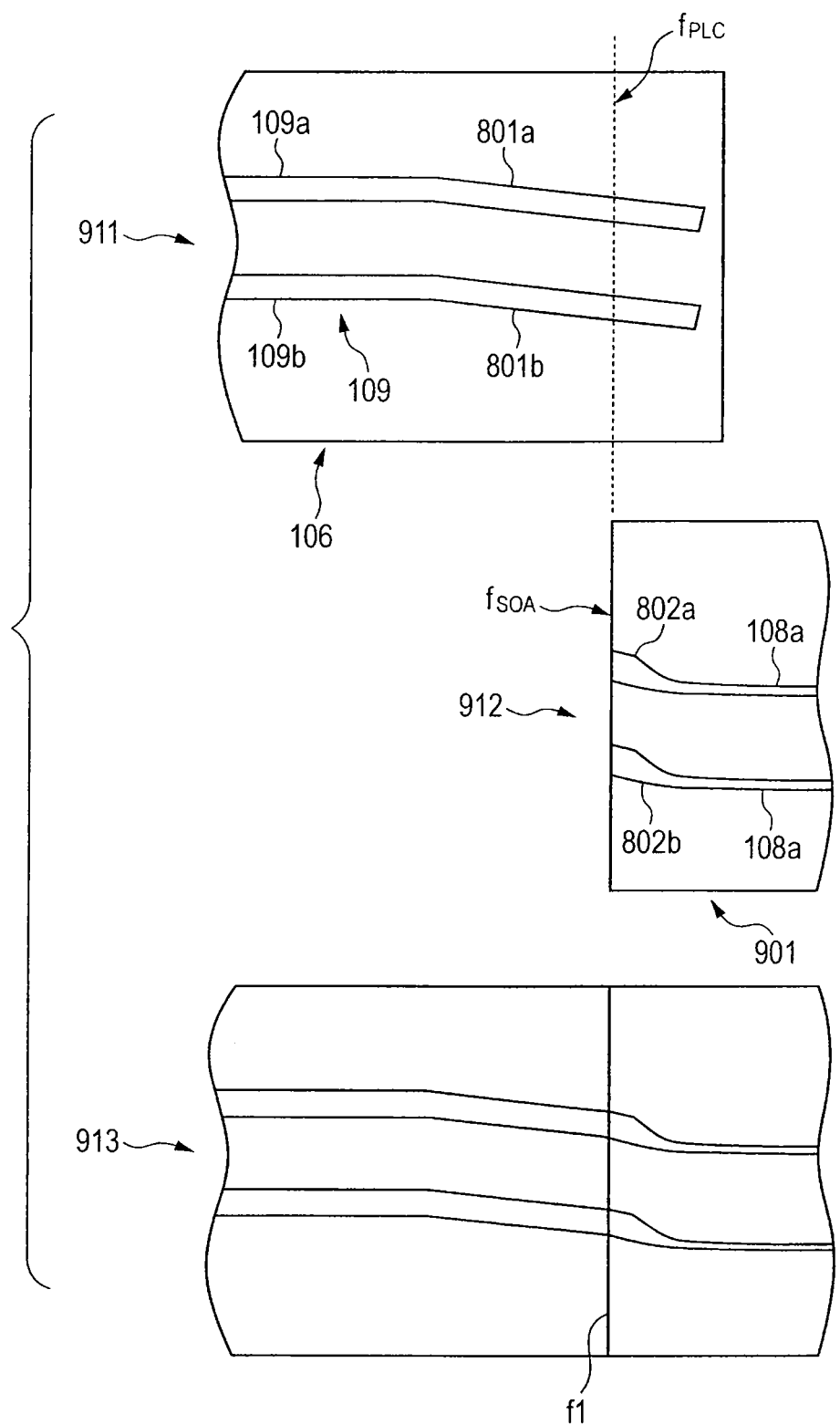
FIG. 9 is a schematic view for explaining a method for manufacturing an SOA-PLC hybrid integrated polarization diversity circuit according to the second embodiment of the present invention, focusing on a vicinity of a bonding surface on which the PLC-PBS chip and the SOA-COS are bonded together.

A method for manufacturing an SOA-PLC hybrid integrated polarization diversity circuit according to the second embodiment is approximately the same as the method for manufacturing an SOA-PLC hybrid integrated polarization diversity circuit according to the first embodiment. Here, FIG. 9 shows only a vicinity of each structure 701 in detail as indicated by reference numerals 911, 912, and 913. Other portions have approximately the same structures as those in the SOA-PLC hybrid integrated polarization diversity circuit 100 according to the first embodiment, and thus are omitted in FIG. 9.

(Step 1)

The PLC-PBS chip 106 is prepared in which the silica-based optical waveguides 110, 109, the silica-based optical waveguides 801a, 801b, and the heaters 102 are formed. The silica-based optical waveguides 801a, 801b are inclined only at the predetermined angle $\theta_1$ with a horizontal direction perpendicular to the facet $f_{PLC}$ serving as the bonding surface where the PLC-PBS chip 106 is bonded to the SOA-COS 105. Test light is propagated from the silica-based optical waveguide 110 side, and the light passing through the heaters 102 is measured on the silica-based optical waveguide 109 side. During the measurement, the heaters 102 are heated for appropriate trimming, and adjustment is made to obtain an appropriate phase difference between the two arms of the MZI 107.

(Step 2)

As indicated by reference numeral 911 in FIG. 9, an unnecessary portion of the PLC-PBS chip 106 is cut away along a broken line. Specifically, an end portion of the PLC-PBS chip 106 is cut by using the dicer or the like so that the facet $f_{PLC}$ can be formed at any point on linear portions 109a, 109b, inclined at the angle of $\theta_1$, of the silica-based optical waveguides 801a, 801b. The facet $f_{PLC}$ formed by the cutting is modified by optical polishing to have a sufficiently fine surface roughness. By the aforementioned processing, a cross-section of the PLC-PBS chip 106 is formed on which the PLC-PBS chip 106 is coupled to the semiconductor optical waveguides 802a, 802b. The slit 104 is formed by using the dicer or the like in such a manner as to be inclined at the predetermined angle, not perpendicularly, with the upper surface of the PLC-PBS chip 106. The half-wave plate 103 is placed in the slit 104. The half-wave plate 103 is placed on the silica-based optical waveguide 109a side which the TM mode light is split into from the MZI 107.

(Step 3)

As indicated by reference numeral 912 in FIG. 9, the SOA-COS 105 is prepared in which the linear portions 108a of the semiconductor optical waveguide, the SSCs 802a, 802b, and the SOAs 112 are formed. The SSCs 802a, 802b are the tapered semiconductor optical waveguides inclined at the predetermined angle (so that the perpendicular of the bonding surface f1 and the axis C2 can make the angle of $\theta_2$). The SOA-COS 105 is cleaved in such a manner that light is emitted from the semiconductor optical waveguides 802a, 802b at an angle of $\theta_2$, and a facet $f_{SOA}$ is formed where the SOA-COS 105 is coupled to the PLC-PBS chip 106. The linear portions 108a of the semiconductor optical waveguide and the SOAs 112 are formed in the buried mesa structure. The U-turn portion 108b of the semiconductor optical waveguide is formed in the high-mesa structure. The facet $f_{SOA}$ of the SOA-COS 105 is coated with the AR coating 803.

(Step 4)

As indicated by reference numeral 913 in FIG. 9, the optical waveguides of the chips are aligned, and the chips are fixed to each other by using an adhesive or the like. The bonding surface f1 of the waveguides is formed in a space where the two facets, the facet $f_{PLC}$ on the PLC-PBS chip 106 side and the facet $f_{SOA}$ on the SOA-COS 105 side, face to each other and which allows optical coupling between the silica-based optical waveguide 801a and the semiconductor optical waveguide 802a and between the silica-based optical waveguide 801b and the semiconductor optical waveguide 802b. Note that the details, the order, and the like of the processing included in Steps 1 to 4 above may be appropriately adjusted.

(Third Embodiment)
(Structure)

Figure 10:
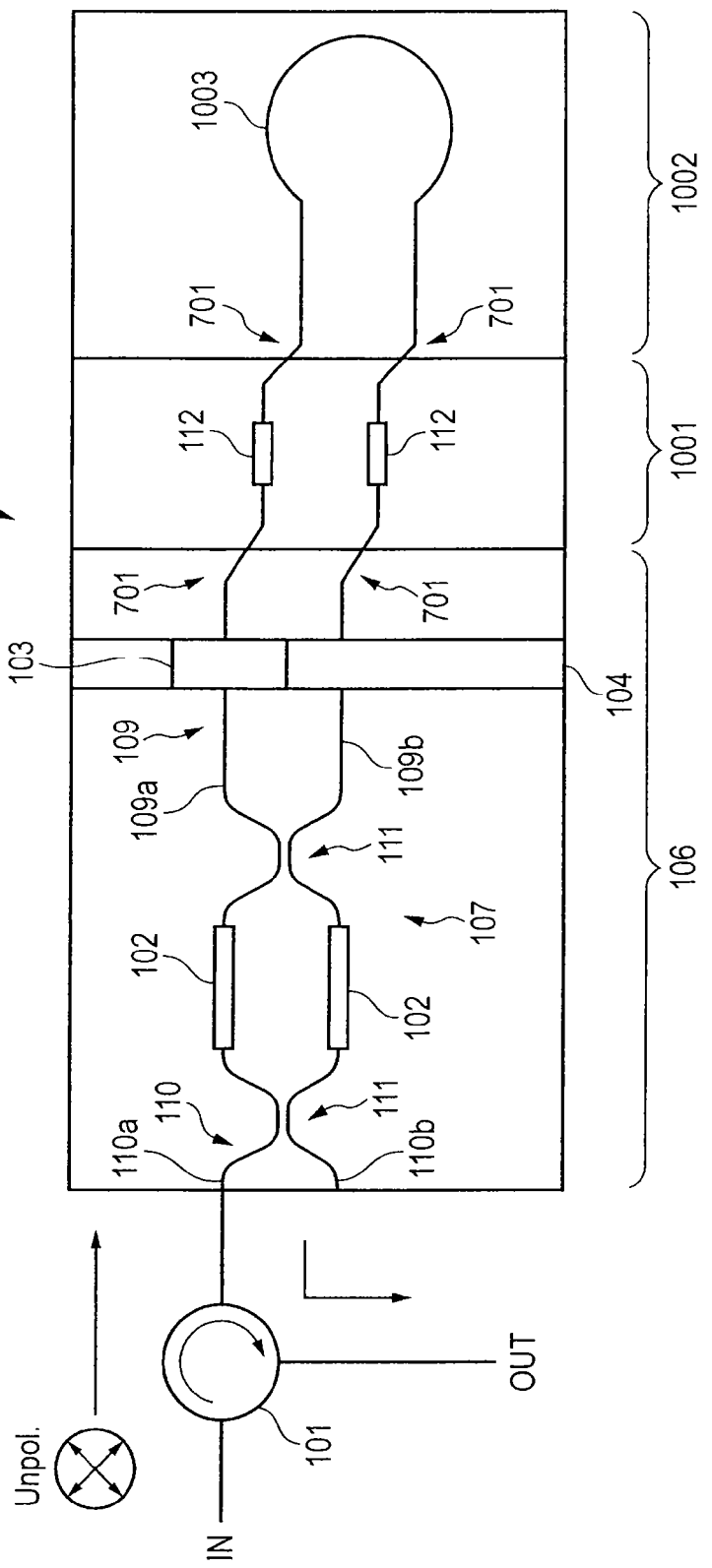
FIG. 10 is a schematic view showing a structure of an SOA-PLC hybrid integrated polarization diversity circuit according to a third embodiment of the present invention.

FIG. 10 is a schematic view showing a structure of an SOA-PLC hybrid integrated polarization diversity circuit 1000 according to the third embodiment of the present invention. The SOA-PLC hybrid integrated polarization diversity circuit 1000 according to the third embodiment has approximately the same structure as the structures of the SOA-PLC hybrid integrated polarization diversity circuits 100 and 700 according to the first and second embodiments. Hence, this embodiment includes operations and advantageous effects of the SOA-PLC hybrid integrated polarization diversity circuits 100 and 700 according to the first and second embodiments. However, in this embodiment, a turning portion of an optical waveguide is not formed in an SOA-COS 1001, but a U-turn silica-based optical waveguide 1003 is formed in a U-turn PLC chip 1002 so that light amplified by the SOAs 112 can be returned to the MZI 107. The SOAs 112 are formed in linear portions of the semiconductor optical waveguides of the SOA-COS 1001. That is, in the third embodiment, light propagated from the PLC-PBS chip 106 is amplified by the SOAs 112 formed in the SOA-COS 1001, makes a turn in the U-turn silica-based optical waveguide 1003 formed in the U-turn PLC chip 1002, is again amplified by the SOAs 112 formed in the SOA-COS 1001, and returns to the PLC-PBS chip 106.

The SOA-PLC hybrid integrated polarization diversity circuit 1000 according to this embodiment also uses structures 701 on bonding portions between the PLC-PBS chip 106 and the SOA-COS 1001 and between the SOA-COS 1001 and the U-turn PLC chip 1002, the structures 701 configured to reduce light propagation loss due to a difference in core size and the reflection on the bonding surface as in the feature of the SOA-PLC hybrid integrated polarization diversity circuit 700 according to the second embodiment.

(Operations)

As described above, the larger the relative refractive index difference of an optical waveguide is, the smaller the radius of curvature of a turning portion can be made. Consequently, the size of the circuit as a whole can be made smaller. However, in contrast to the SOA-PLC hybrid integrated polarization diversity circuit 700 according to the second embodiment, it is not necessarily easy to manufacture a single chip in which semiconductor optical waveguides having the buried mesa structure suitable for an SOA and semiconductor optical waveguides having the high-mesa structure suitable for a U-turn with a small radius of curvature are coupled together.

When the waveguides of SOA-COS is formed only with the buried mesa structure, the waveguides can be formed more easily. Although having a slightly larger overall footprint than that of the SOA-PLC hybrid integrated polarization diversity circuit 700 according to the second embodiment, the SOA-PLC hybrid integrated polarization diversity circuit 1000 according to this embodiment achieves easier manufacturing of the SOA-COS 1001 and enhances feasibility of a polarization diversity circuit.

(Manufacturing Method)

Figure 11:
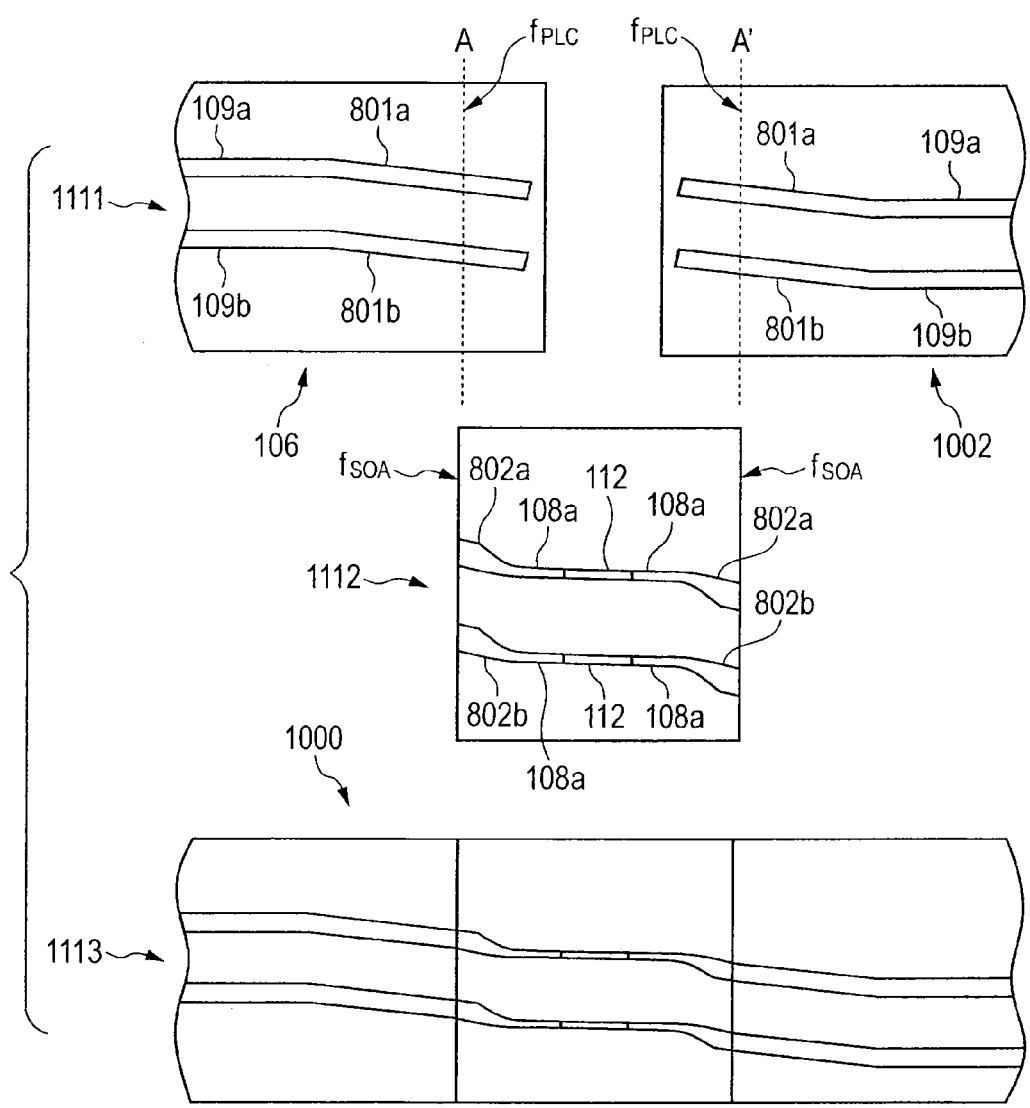
FIG. 11 is a schematic view for explaining a method for manufacturing an SOA-PLC hybrid integrated polarization diversity circuit according to the third embodiment of the present invention, focusing on a vicinity of boding surfaces on which a PLC-PBS chip, an SOA-COS, and a U-turn PLC chip are bonded.

A method for manufacturing an SOA-PLC hybrid integrated polarization diversity circuit according to the third embodiment is approximately the same as the methods for manufacturing an SOA-PLC hybrid integrated polarization diversity circuit according to the first and second embodiments. Here, FIG. 11 shows only vicinities of the structures 701 in detail on the bonding portions between the PLC-PBS chip 106 and the SOA-COS 1001 and between the SOA-COS 1001 and the U-turn PLC chip 1002. Other portions have approximately the same structures as those in the SOA-PLC hybrid integrated polarization diversity circuits 100 and 700 according to the first and second embodiments, and thus are omitted in FIG. 11.

(Step 1)

The PLC-PBS chip 106 is prepared in which the silica-based optical waveguides 110, 109, the silica-based optical waveguides 801a, 801b inclined at the predetermined angle, and the heaters 102 are formed. Test light is propagated from the silica-based optical waveguide 110 side, and the light passing through the heaters 102 is measured on the silica-based optical waveguide 109 side. During the measurement, the heaters 102 are heated for appropriate trimming, and adjustment is made to obtain an appropriate phase difference between the two arms of the MZI 107. In addition, the U-turn PLC chip 1002 is prepared in which the U-turn silica-based optical waveguide 1003, the silica-based optical waveguide 109, and the silica-based optical waveguides 801a, 801b inclined at the predetermined angle are formed.

(Step 2)

As indicated by reference numeral 1111 in FIG. 11, unnecessary portions of the PLC-PBS chip 106 and the U-turn PLC chip 1002 are cut away along broken lines A and A'. Specifically, end portions of the PLC-PBS chip 106 and the U-turn PLC chip 1002 are cut by using the dicer or the like so that the facet $f_{PLC}$ can be formed at any point of each of the linear portions 109a, 109b, inclined at the angle of $\theta_1$, of the corresponding one of the silica-based optical waveguides 801a, 801b. The facet $f_{PLC}$ formed by the cutting is modified by optical polishing to have a sufficiently fine surface roughness. By the aforementioned processing, cross-sections of the PLC-PBS chip 106 and the U-turn PLC chip 1002 are formed on which the PLC-PBS chip 106 and the U-turn PLC chip 1002 are coupled to the semiconductor optical waveguides 802a, 802b. The slit 104 is formed by using the dicer or the like in such a manner as to be inclined at the predetermined angle, not perpendicularly, with the upper surface of the PLC-PBS chip 106. The half-wave plate 103 is placed in the slit 104. The half-wave plate 103 is placed on the silica-based optical waveguide 109a side which the TM mode light is split into from the MZI 107.

(Step 3)

As indicated by reference numeral 1112 in FIG. 11, the SOA-COS 1001 is prepared in which the linear portions 108a of the semiconductor optical waveguide, the inclined SSCs 802a, 802b, and the SOAs 112 are formed. The SSCs 802a, 802b are the tapered semiconductor optical waveguides. The SOA-COS 1001 is cleaved in such a manner that light is emitted from the semiconductor optical waveguides 802a, 802b at an angle of $\theta_2$, and facets $f_{SOA}$ are formed where the SOA-COS 1001 is coupled to the PLC-PBS chip 106 and the U-turn PLC chip 1002. Thereafter, the facets $f_{SOA}$ which are cross-sections of the SOA-COS 1001 on both sides are coated with the AR coating 803 (see FIG. 8B).

(Step 4)

As indicated by reference numeral 1113 in FIG. 11, the optical waveguides of the chips are aligned, and the chips are fixed to each other by using an adhesive or the like. Bonding surfaces f1 of the waveguides are each formed in a space where the two facets face each other and which allows optical coupling between the silica-based optical waveguide 801a and the semiconductor optical waveguide 802a and between the silica-based optical waveguide 801b and the semiconductor optical waveguide 802b. Combinations of the two facets are: the facet $f_{SOA}$ on the SOA-COS 1112 side and the facet $f_{PLC}$ on the PLC-PBS chip 106 side; and the facet $f_{SOA}$ on the SOA-COS 1112 side and the facet $f_{PLC}$ on the U-turn PLC chip 1002 side.

Note that the details, the order, and the like of the processing included in Steps 1 to 4 above may be appropriately adjusted.

EXAMPLE

FIG. 12 shows two types of structures 1211 and 1212 for measuring PDG of an SOA. Specifically, FIG. 12 shows a tunable light source (TLS) 1201, an erbium-doped fiber amplifier (EDFA) 1202, a polarization controller (PC) 1203, an attenuator (ATT) 1204, an input-side optical switch 1205, an optical spectrum analyzer (OSA) 1206, an optical power meter (OPM) 1207, a 10:1 splitter 1208, an isolator 1209, an output-side optical switch 1210, a reference structure 1211, and an SOA-PLC hybrid integrated polarization diversity circuit structure 1212 according to the third embodiment. In the structure 1211, an ST-PLC chip 1211A having two straight optical waveguides, an SOA-COS having SOAs, and a U-PLC chip having a U-turn optical waveguide are bonded together. The structure 1211 does not include a circulator and a PBS in comparison with the structure 1212.

Figure 13A:
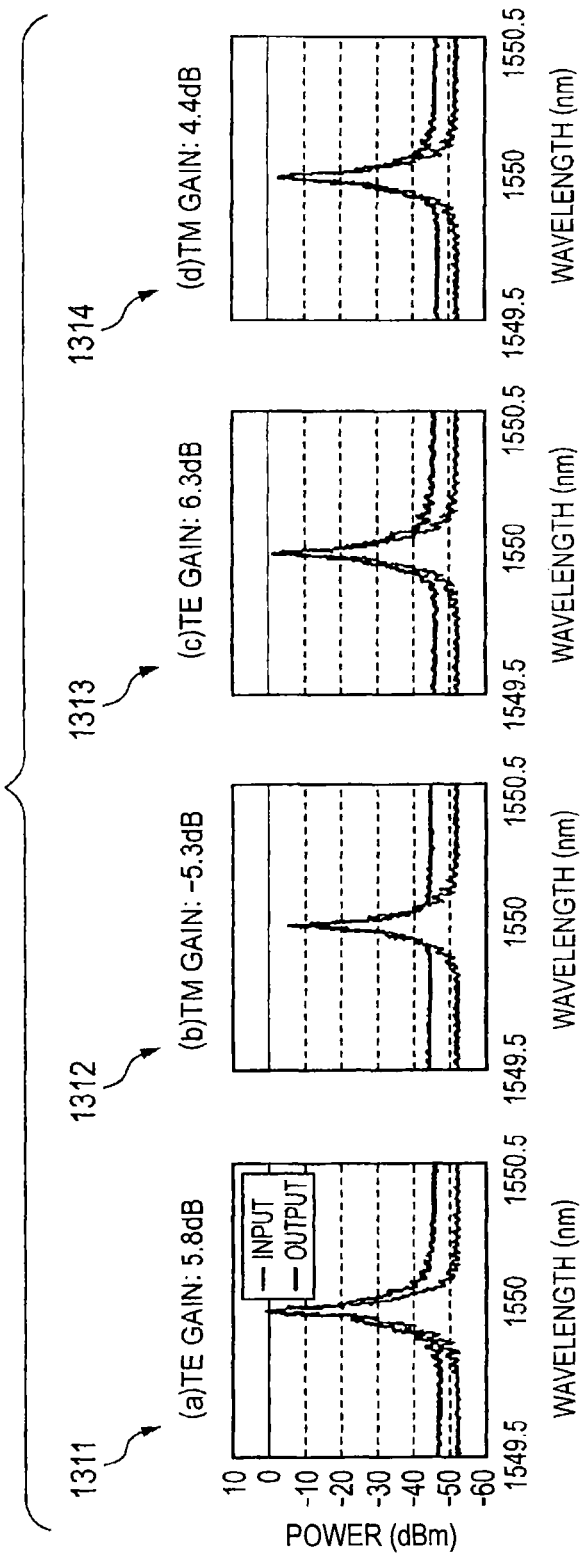
FIG. 13A shows graphs of measurement results in Example of the present invention.

When light is made incident from the TLS 1201 to the structure 1211, the light to be propagated into the structure 1211 is straightforward propagated in one direction from the input-side optical switch 1205 to the output-side optical switch 1210. This is because the structure 1211 does not use a polarization diversity circuit (PDC). In order to check PDG of the SOAs in the structure 1211, TE mode light (center wavelength λ=1550 nm) and TM mode light were made incident from the TLS 1201. The measurement results with the TE and TM mode light are shown in graphs denoted by reference numerals 1311 and 1312 in FIG. 13A, respectively. Note that graphs denoted by reference numerals 1311 to 1314 in FIG. 13A each have scales from 1549.5 nm to 1550.5 nm through 1550.0 nm on the horizontal axis, and from −60 dBm to +10 DBm through 0 dBm on the vertical axis. A spectrum at the top represented by a thick line in each graph is a spectrum of light outputted after passing through a corresponding one of the structure 1211 and the structure 1212, while a spectrum at the bottom is a spectrum of inputted light.

In addition, in order to check PDG of the SOAs in the structure 1212, TE mode light (center wavelength λ=1550 nm) and TM mode light were made incident from the TLS 1201. The measurement results with the TE and TM mode light are shown in the graphs denoted by reference numerals 1313 and 1314 in FIG. 13A, respectively. Note that the return loss of propagated light was reduced to −50 dB or lower in the structure 1212 by setting the angle $\theta_1$ to 15° and the angle $\theta_2$ to 7°.

In the structure 1211, an amplification gain of 5.8 dB was obtained from the TE mode light, while a negative amplification gain of −5.3 dB was obtained from the TM mode light. In the structure 1212, an amplification gain of 6.3 dB was obtained from the TE mode light, while an amplification gain of 4.4 dB was obtained from the TM mode light.

These results show that optical amplification gain was obtained from the TE mode light by the SOAs, regardless of whether the structure 1211 or the structure 1212, that is, regardless of whether the PDC structure is present or not. In contrast, as for the TM mode light, the optical amplification gain was obtained by the SOAs in the structure 1212, while the negative optical amplification gain (that is, absorption) was obtained by the SOAs in the structure 1211.

Accordingly, the PDG of the structure 1211 was 11.1 dB, while the PDG of the structure 1212 was 1.9 dB. The PDG was largely reduced by using the SOA-PLC hybrid integrated polarization diversity circuit (the structure 1212) according to the third embodiment of the present invention.

Figure 13B:
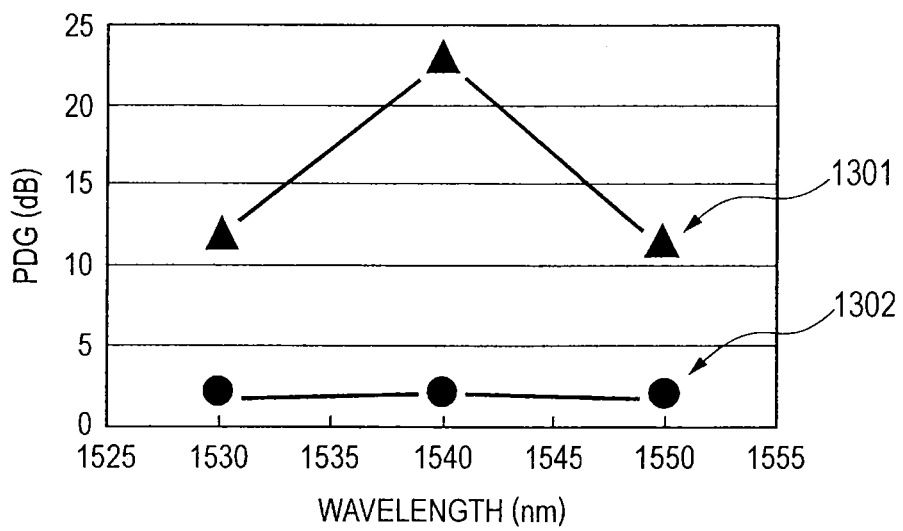
FIG. 13B shows a graph of measurement results of the polarization dependent gain obtained when an incident light wavelength is changed in Example of the present invention.
Figure 14:
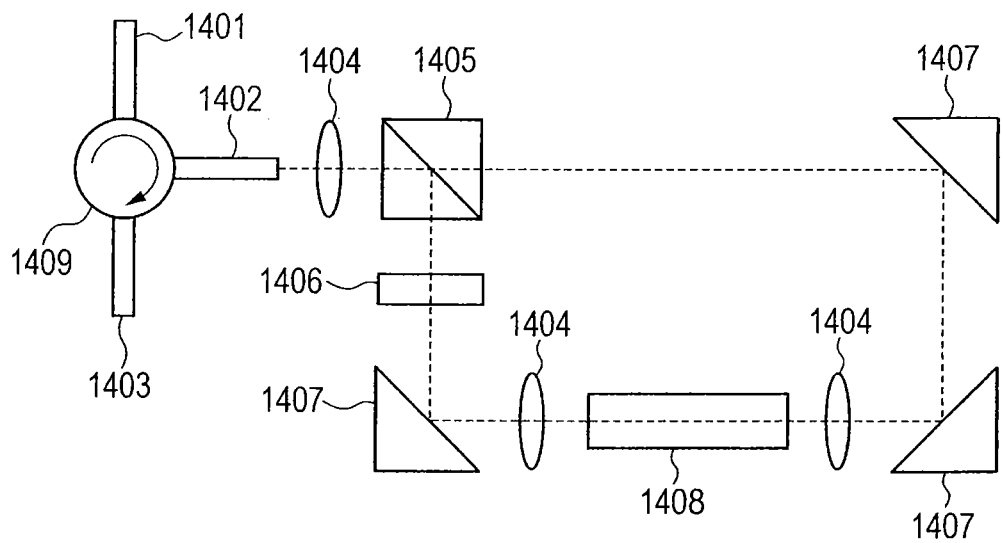
FIG. 14 is a schematic view of a conventional polarization independent SOA module.

FIG. 13B shows changes of PDG 1301 of the structure 1211 and PDG 1302 of the structure 1212 measured when the center wavelengths of incident light was set to 1530 nm, 1540 nm, and 1550 nm, respectively. In the structure 1211, the PDG took on a large value of 11.1 dB to 22.9 dB. In contrast, in the structure 1212, the PDG was 1.2 dB which is much smaller than the value of the structure 1211. This showed that the SOA-PLC hybrid integrated polarization diversity circuit according to this example exerts an effect of reducing the PDG of the SOAs.

What is claimed is:

1. An SOA-PLC hybrid integrated polarization diversity circuit comprising a PLC-PBS chip and a semiconductor optical amplifier-chip on submount (SOA-COS) whose respective waveguides are coupled to each other, wherein
the PLC-PBS chip comprises:
a first optical waveguide and a second optical waveguide;
a Mach-Zehnder interferometer circuit configured to divide inputted light into TM mode light and TE mode light and to output the divided TM mode light to the first optical waveguide and the divided TE mode light to the second optical waveguide; and
a polarization rotation mechanism built in the first optical waveguide by which the TM mode light is converted to the TE mode light and the TE mode light is converted to the TM mode light,
the SOA-COS comprises:
a third optical waveguide connected to the first optical waveguide;
a fourth optical waveguide connected to the second optical waveguide; and
an SOA formed in at least one of the third and fourth optical waveguides, and
one end of the third optical waveguide and one end of the fourth optical waveguide are connected to a U-turn optical waveguide, the one ends being not connected to the first optical waveguide and the second optical waveguide, respectively.

2. The SOA-PLC hybrid integrated polarization diversity circuit according to claim 1, wherein the U-turn optical waveguide is formed on the SOA-COS.

3. The SOA-PLC hybrid integrated polarization diversity circuit according to claim 2, wherein
the first and second optical waveguides have a buried mesa structure, and
the U-turn optical waveguide has a high-mesa structure.

4. The SOA-PLC hybrid integrated polarization diversity circuit according to claim 1, further comprising an U-turn PLC chip having a waveguide coupled to the SOA-COS, wherein
the U-turn optical waveguide is formed on the U-turn PLC chip.

5. The SOA-PLC hybrid integrated polarization diversity circuit according to claim 1, wherein at least one of the first to fourth optical waveguides comprises a spot size converter on a bonding surface where the two chips are bonded to each other.

6. The SOA-PLC hybrid integrated polarization diversity circuit according to claim 1, wherein
all of the optical waveguides bonded on a bonding surface where the two chips are bonded are inclined to the bonding surface, and
the corresponding inclined optical waveguides are bonded to each other, making a first angle and a second angle, respectively, with the bonding surface.

7. The SOA-PLC hybrid integrated polarization diversity circuit according to claim 1, wherein an anti-reflection coating is formed on the bonding surface where the two chips are bonded.

* * * * *